United States Patent
Choi et al.

(10) Patent No.: US 9,184,140 B2
(45) Date of Patent: Nov. 10, 2015

(54) SEMICONDUCTOR PACKAGES HAVING EMI SHIELDING LAYERS, METHODS OF FABRICATING THE SAME, ELECTRONIC SYSTEMS INCLUDING THE SAME, AND MEMORY CARDS INCLUDING THE SAME

(71) Applicant: SK HYNIX INC., Icheon (KR)

(72) Inventors: Hyung Ju Choi, Seoul (KR); Jong Hyun Kim, Seoul (KR)

(73) Assignee: SK HYNIX INC., Icheon (KR)

(*) Notice: Subject to any disclaimer, the term of this patent is extended or adjusted under 35 U.S.C. 154(b) by 0 days.

(21) Appl. No.: 14/316,261

(22) Filed: Jun. 26, 2014

(65) Prior Publication Data

US 2015/0179588 A1    Jun. 25, 2015

(30) Foreign Application Priority Data

Dec. 23, 2013    (KR) .......................... 10-2013-0160949

(51) Int. Cl.
```
H01L 23/552    (2006.01)
H01L 23/60     (2006.01)
H01L 23/498    (2006.01)
H01L 25/065    (2006.01)
H01L 23/00     (2006.01)
```

(52) U.S. Cl.
CPC .......... *H01L 23/60* (2013.01); *H01L 23/49822* (2013.01); *H01L 23/49838* (2013.01); *H01L 23/552* (2013.01); *H01L 24/97* (2013.01); *H01L 25/065* (2013.01); *H01L 2224/48091* (2013.01); *H01L 2224/48145* (2013.01); *H01L 2224/48227* (2013.01); *H01L 2225/06562* (2013.01); *H01L 2924/15184* (2013.01)

(58) Field of Classification Search
CPC ................. H01L 2224/97; H01L 2924/01013; H01L 2924/01029; H01L 2924/01033; H01L 2924/01047; H01L 2924/01078; H01L 2924/3025; H01L 23/3121; H01L 2224/81
USPC .......... 257/659, 660, 621, E21.705, E25.018; 438/108, 26, 51

See application file for complete search history.

(56) References Cited

U.S. PATENT DOCUMENTS

| | | | | |
|---|---|---|---|---|
| 5,639,989 A | * | 6/1997 | Higgins, III .................. | 174/386 |
| 2005/0258532 A1 | * | 11/2005 | Yoshikawa et al. ........... | 257/698 |
| 2006/0091558 A1 | * | 5/2006 | Huang et al. .................. | 257/774 |
| 2011/0115059 A1 | | 5/2011 | Lee et al. | |
| 2011/0115060 A1 | | 5/2011 | Chiu et al. | |

* cited by examiner

*Primary Examiner* — Thinh T Nguyen

(57) ABSTRACT

Semiconductor packages are provided. In some embodiments, the semiconductor package includes a substrate, a first ground line including a first internal ground line disposed along edges of the substrate and a plurality of first extended ground lines between the first internal ground line and sidewalls of the substrate, a chip on the substrate, a molding member disposed on the substrate to cover the chip, and an electromagnetic interference (EMI) shielding layer covering the molding member, the EMI shielding layer extending along the sidewalls of the substrate and contacting the end portions of the plurality of first extended ground lines. The plurality of first extended ground lines include end portions that are exposed at the sidewalls of the substrate.

6 Claims, 12 Drawing Sheets

SEMICONDUCTOR PACKAGES HAVING EMI SHIELDING LAYERS, METHODS OF FABRICATING THE SAME, ELECTRONIC SYSTEMS INCLUDING THE SAME, AND MEMORY CARDS INCLUDING THE SAME

CROSS-REFERENCE TO RELATED APPLICATION

The present application claims priority under 35 U.S.C. 119(a) to Korean Application No. 10-2013-0160949, filed on Dec. 23, 2013, in the Korean Intellectual Property Office, and is incorporated herein by reference in its entirety.

BACKGROUND

1. Technical Field

Embodiments of the present disclosure relate to semiconductor packages and, more particularly, to semiconductor packages having EMI shielding layers, methods of fabricating the same, electronic systems including the same, and memory cards including the same.

2. Related Art

Electromagnetic interference (EMI) occurs when high frequency noise generated from electronic circuits or electronic systems affect the performance of other circuits or other systems. EMI may also adversely affect humans. Typically, attempts to suppress EMI include designing electronic circuits (or electronic systems) to prevent the generation of high frequency noise, shielding the electronic circuits (or the electronic systems) to prevent the propagation of high frequency noise, and so on.

SUMMARY

Various embodiments are directed to semiconductor packages having EMI shielding layers, methods of fabricating the same, electronic systems including the same, and memory cards including the same.

According to some embodiments, a semiconductor package includes a substrate, a first ground line including a first internal ground line disposed along edges of the substrate and a plurality of first extended ground lines between the first internal ground line and sidewalls of the substrate, a chip on the substrate, a molding member disposed on the substrate to cover the chip, and an electromagnetic interference (EMI) shielding layer covering the molding member, the EMI shielding layer extending along the sidewalls of the substrate and contacting the end portions of the plurality of first extended ground lines. The plurality of first extended ground lines include end portions that are exposed at the sidewalls of the substrate.

According to further embodiments, a semiconductor package includes a substrate, a first ground line including a first internal ground line disposed along edges of the substrate and a plurality of first extended ground lines extending between the first internal ground line and sidewalls of the substrate, a second ground line including a second internal ground line disposed along the edges of the substrate and a plurality of second extended ground lines extending between the second internal ground line and the sidewalls of the substrate, a chip on the substrate, a molding member disposed on the substrate to cover the chip, and an electromagnetic interference (EMI) shielding layer covering the molding member and extending along the sidewalls of the substrate. The plurality of first extended ground lines include end portions that are exposed at the sidewalls of the substrate. The plurality of second extended ground lines include end portions that are exposed at the sidewalls of the substrate. The EMI shielding layer contacts the end portions of the plurality of first extended ground lines and the end portions of the plurality of second extended ground lines.

According to further embodiments, a semiconductor package includes a substrate, a first ground line including a first internal ground line disposed along edges of the substrate and a plurality of first extended ground lines extending between the first internal ground line and sidewalls of the substrate, a second ground line including a second internal ground line disposed along the edges of the substrate and a plurality of second extended ground lines extending between the second internal ground line and the sidewalls of the substrate, a third ground line including a third internal ground line disposed along the edges of the substrate and a plurality of third extended ground lines extending between the third internal ground line and the sidewalls of the substrate, a chip on the substrate, a molding member disposed on the substrate to cover the chip, and an electromagnetic interference (EMI) shielding layer covering the molding member and extending onto the sidewalls of the substrate. The plurality of first extended ground lines including end portions that are exposed at the sidewalls of the substrate. The plurality of second extended ground lines including end portions that are exposed at the sidewalls of the substrate. The plurality of third extended ground lines including end portions that are exposed at the sidewalls of the substrate. The EMI shielding layer contacts the end portions of the plurality of first extended ground lines, the end portions of the plurality of second extended ground lines, and the end portions of the plurality of third extended ground lines.

According to further embodiments, a method of fabricating a semiconductor package includes providing a substrate strip having a plurality of ground lines including a plurality of laterally arranged, internal ground lines and a plurality of extended ground lines extending between the plurality of internal ground lines to connect the plurality of internal ground lines to each other. Chips are attached to a top surface of the substrate strip. A molding layer is formed on the top surface of the substrate strip to cover the chips. The molding layer and the substrate strip are cut to separate the substrate strip into a plurality of substrates having sidewalls, to separate the molding layer into a plurality of molding members, and to expose end portions of the extended ground lines at the sidewalls of the substrates. An electromagnetic interference (EMI) shielding layer is formed to cover each of the molding members and to extend along the sidewalls of each of the substrates. The EMI shielding layer contacts the exposed end portions of the extended ground lines.

According to further embodiments, an electronic system includes a memory and a controller coupled with the memory through a bus. The memory or the controller includes a substrate, a first ground line including a first internal ground line disposed along edges of the substrate and a plurality of first extended ground lines between the first internal ground line and sidewalls of the substrate, a chip on the substrate, a molding member disposed on the substrate to cover the chip, and an electromagnetic interference (EMI) shielding layer covering the molding member, the EMI shielding layer extending along the sidewalls of the substrate and contacting the end portions of the plurality of first extended ground lines. The plurality of first extended ground lines include end portions that are exposed at the sidewalls of the substrate.

According to further embodiments, an electronic system includes a memory and a controller coupled with the memory through a bus. The memory or the controller includes a substrate, a first ground line including a first internal ground line disposed along edges of the substrate and a plurality of first extended ground lines extending between the first internal ground line and sidewalls of the substrate, a second ground line including a second internal ground line disposed along the edges of the substrate and a plurality of second extended ground lines extending between the second internal ground line and the sidewalls of the substrate, a chip on the substrate, a molding member disposed on the substrate to cover the chip, and an electromagnetic interference (EMI) shielding layer covering the molding member and extending along the sidewalls of the substrate. The plurality of first extended ground lines include end portions that are exposed at the sidewalls of the substrate. The plurality of second extended ground lines include end portions that are exposed at the sidewalls of the substrate. The EMI shielding layer contacts the end portions of the plurality of first extended ground lines and the end portions of the plurality of second extended ground lines.

According to further embodiments, an electronic system includes a memory and a controller coupled with the memory through a bus. The memory or the controller includes a substrate, a first ground line including a first internal ground line disposed along edges of the substrate and a plurality of first extended ground lines extending between the first internal ground line and sidewalls of the substrate, a second ground line including a second internal ground line disposed along the edges of the substrate and a plurality of second extended ground lines extending between the second internal ground line and the sidewalls of the substrate, a third ground line including a third internal ground line disposed along the edges of the substrate and a plurality of third extended ground lines extending between the third internal ground line and the sidewalls of the substrate, a chip on the substrate, a molding member disposed on the substrate to cover the chip, and an electromagnetic interference (EMI) shielding layer covering the molding member and extending onto the sidewalls of the substrate. The plurality of first extended ground lines including end portions that are exposed at the sidewalls of the substrate. The plurality of second extended ground lines including end portions that are exposed at the sidewalls of the substrate. The plurality of third extended ground lines including end portions that are exposed at the sidewalls of the substrate. The EMI shielding layer contacts the end portions of the plurality of first extended ground lines, the end portions of the plurality of second extended ground lines, and the end portions of the plurality of third extended ground lines.

According to further embodiments, a memory card includes a memory and a memory controller suitable for controlling an operation of the memory. The memory includes a substrate, a first ground line including a first internal ground line disposed along edges of the substrate and a plurality of first extended ground lines between the first internal ground line and sidewalls of the substrate, a chip on the substrate, a molding member disposed on the substrate to cover the chip, and an electromagnetic interference (EMI) shielding layer covering the molding member, the EMI shielding layer extending along the sidewalls of the substrate and contacting the end portions of the plurality of first extended ground lines. The plurality of first extended ground lines include end portions that are exposed at the sidewalls of the substrate.

According to further embodiments, a memory card includes a memory and a memory controller suitable for controlling an operation of the memory. The memory includes a substrate, a first ground line including a first internal ground line disposed along edges of the substrate and a plurality of first extended ground lines extending between the first internal ground line and sidewalls of the substrate, a second ground line including a second internal ground line disposed along the edges of the substrate and a plurality of second extended ground lines extending between the second internal ground line and the sidewalls of the substrate, a chip on the substrate, a molding member disposed on the substrate to cover the chip, and an electromagnetic interference (EMI) shielding layer covering the molding member and extending along the sidewalls of the substrate. The plurality of first extended ground lines include end portions that are exposed at the sidewalls of the substrate. The plurality of second extended ground lines include end portions that are exposed at the sidewalls of the substrate. The EMI shielding layer contacts the end portions of the plurality of first extended ground lines and the end portions of the plurality of second extended ground lines.

According to further embodiments, a memory card includes a memory and a memory controller suitable for controlling an operation of the memory. The memory includes a substrate, a first ground line including a first internal ground line disposed along edges of the substrate and a plurality of first extended ground lines extending between the first internal ground line and sidewalls of the substrate, a second ground line including a second internal ground line disposed along the edges of the substrate and a plurality of second extended ground lines extending between the second internal ground line and the sidewalls of the substrate, a third ground line including a third internal ground line disposed along the edges of the substrate and a plurality of third extended ground lines extending between the third internal ground line and the sidewalls of the substrate, a chip on the substrate, a molding member disposed on the substrate to cover the chip, and an electromagnetic interference (EMI) shielding layer covering the molding member and extending onto the sidewalls of the substrate. The plurality of first extended ground lines including end portions that are exposed at the sidewalls of the substrate. The plurality of second extended ground lines including end portions that are exposed at the sidewalls of the substrate. The plurality of third extended ground lines including end portions that are exposed at the sidewalls of the substrate. The EMI shielding layer contacts the end portions of the plurality of first extended ground lines, the end portions of the plurality of second extended ground lines, and the end portions of the plurality of third extended ground lines.

BRIEF DESCRIPTION OF THE DRAWINGS

Embodiments of the present disclosure will become more apparent in view of the attached drawings and accompanying detailed description, in which.

DESCRIPTION OF SPECIFIC EMBODIMENTS

A semiconductor package according to an embodiment of the present disclosure may include a ground line and an electromagnetic interference (EMI) shielding layer. The ground line may include an internal ground line and a plurality of extended ground lines. The internal ground line may run along edges of a substrate to form a closed loop shape, and the plurality of extended ground lines may extend from the internal ground line to reach sidewalls of the substrate. Thus, ends of the plurality of extended ground lines may be exposed at the sidewalls of the substrate.

The EMI shielding layer may contact the exposed ends of the extended ground lines and the sidewalls of the substrate. Accordingly, the EMI shielding layer may contact the sidewalls of the substrate and the exposed ends of the extended ground lines, which may alternate along the sidewalls of the substrate. As a result, a total adhesive strength of the EMI shielding layer may be higher or greater than the adhesive strength between the EMI shielding layer and one of the ground lines, In addition, since the ground line that is disposed on a bottom surface of the substrate includes the extended ground lines, a solder resist layer disposed on the bottom surface of the substrate may also alternately contact the substrate and the ground line (e.g., the extended ground lines) along the edges of the substrate. Thus, even though an adhesive strength between the solder resist layer and the ground line is low, a relatively high adhesive strength between the solder resist layer and the substrate may prevent detachment of the solder resist layer from the substrate.

Figure 1:
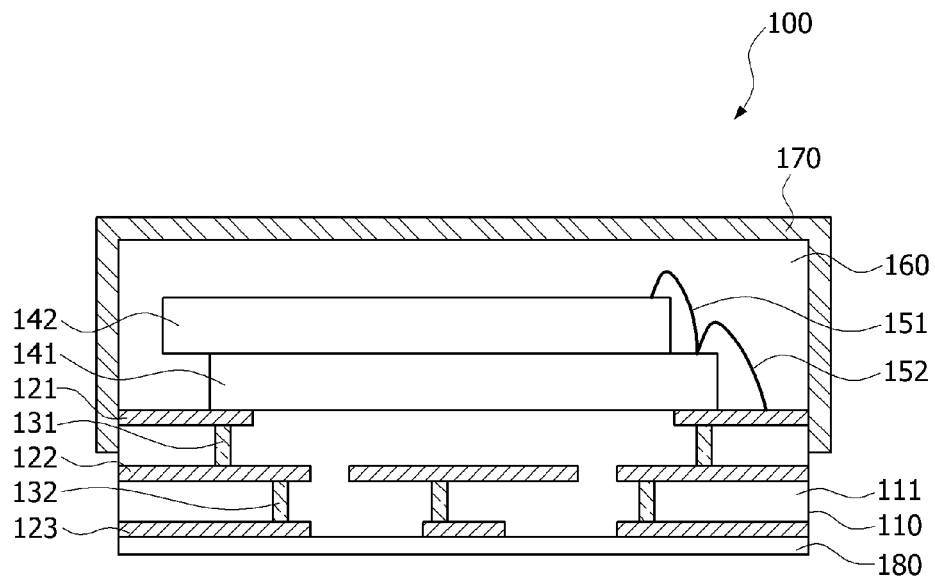
FIG. 1 is a cross-sectional view illustrating a semiconductor package according to an embodiment of the present disclosure.

Referring to FIG. 1, a semiconductor package 100 according to an embodiment may include a substrate 110, chips 141 and 142 disposed on the substrate 110, and a molding member 160 covering the chips 141 and 142. The substrate 110 may include an insulation layer 111. Although FIG. 1 illustrates an example in which two chips 141 and 142 are disposed on the substrate 110, other configurations are possible. For example, in some embodiments, a single chip, or at least three chips, may be disposed on the substrate 110.

When at least two chips are disposed on the substrate 110, the at least two chips may be vertically stacked on the substrate 110, or may be arranged laterally on the substrate 110. In the present embodiment, the lower chip 141 and the upper chip 142 may be electrically connected to each other through first wires 151, and the lower chip 141 and the substrate 110 may be electrically connected to each other through second wires 152. In some embodiments, the lower and upper chip 141 and 142 may be flip chips. In some embodiments, the lower and upper chips 141 and 142 may be electrically connected to the substrate 110 without use of the first and second wires 151 and 152. A top surface of the substrate 110, the lower and upper chips 141 and 142, and the first and second wires 151 and 152 may be covered with the molding member 160. In some embodiments, the molding member 160 may be an epoxy molding compound (EMC) material. Sidewalls of the molding member 160 may be vertically aligned with sidewalls of the substrate 110.

Figure 2:
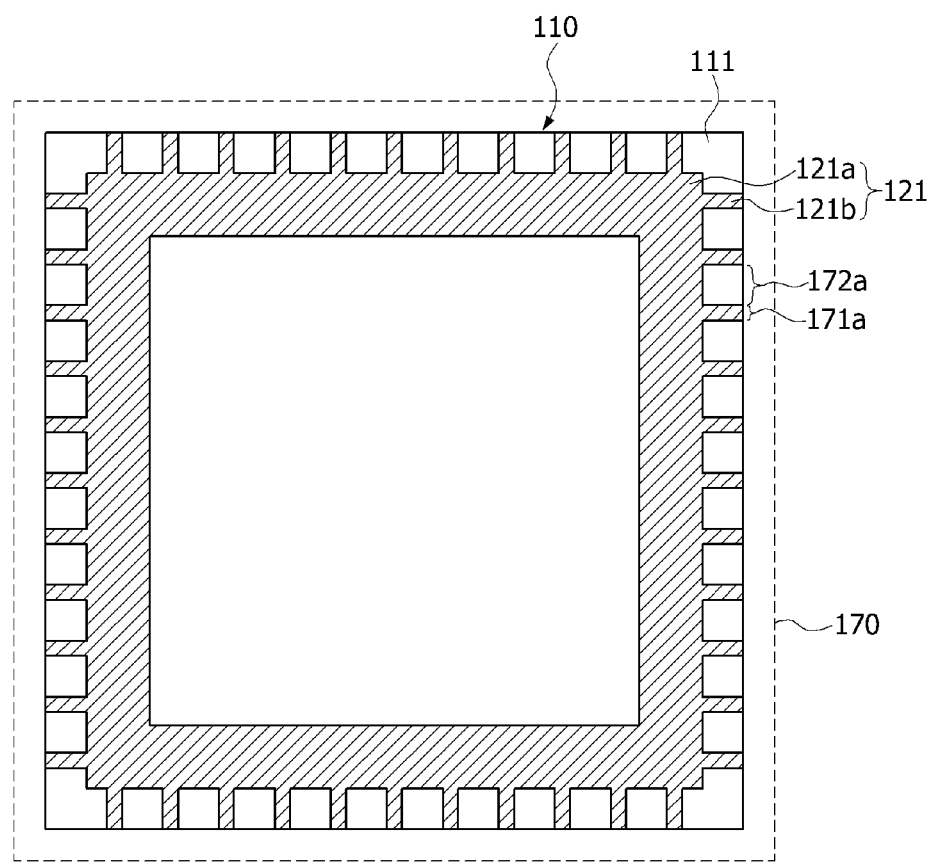
FIG. 2 is a layout diagram illustrating a first ground line included in the semiconductor package of FIG. 1.

A first ground line 121 may be disposed on a top surface of the substrate 110. Although not shown in the drawings, a plurality of power lines and signal lines may be disposed on the top surface of the substrate 110. As illustrated in FIG. 2, the first ground line 121 may include a first internal ground line 121a disposed on the top surface of the substrate 110 along edges of the substrate 110 and first extended ground lines 121b extending from the first internal ground line 121a toward sidewalls of the substrate 110. In some embodiments, the first internal ground line 121a and the first extended ground lines 121b may include a copper material.

In the present embodiment, the first internal ground line 121a may have a rectangular closed loop shape in a plan view. However, the first internal ground line 121a may be configured in a variety of different shapes or geometries. For example, in some embodiments, the first internal ground line 121a may have an open loop shape in a plan view. Although not shown in the drawings, another internal ground line may be additionally disposed on the substrate 110 and surrounded by the first internal ground line 121a.

The first extended ground lines 121b may extend from the first internal ground line 121a toward the sidewalls of the substrate 110 such that ends of the first extended ground lines 121b are exposed at the sidewalls of the substrate 110. The number of the first extended ground lines 121b may be at least two, and the first extended ground lines 121b may be arranged along the edges of the substrate 110 such that they are uniformly or non-uniformly spaced apart from each other by a predetermined distance or distances. In some embodiments, the insulation layer 111 and the first extended ground lines 121b may be arranged to alternate along the edges of the substrate 110.

The EMI shielding layer 170 may be disposed on a top surface and sidewalls of the molding member 160 and may extend along the sidewalls of the substrate 110 by a predetermined length. In some embodiments, the EMI shielding layer 170 may include at least one metal layer. A portion of the EMI shielding layer 170 extending onto the sidewalls of the substrate 110 may contact the insulation layer 111 and the first extended ground lines 121b, which are arranged to alternate along the sidewalls of the substrate 110.

That is, the EMI shielding layer 170 may contact end portions 171a of the first extended ground lines 121b and exposed portions 172a of the insulation layer 111 which are arranged to alternate along the sidewalls of the substrate 110, as illustrated in FIG. 2.

In some embodiments, an adhesive strength between the EMI shielding layer 170 and the first extended ground lines 121b may be different from an adhesive strength between the EMI shielding layer 170 and the insulation layer 111. However, according to the present embodiment, the EMI shielding layer 170 may alternately contact the end portions 171a of the first extended ground lines 121b and the exposed portions 172a of the insulation layer 111, as described herein. Thus, when one of the adhesive strength between the EMI shielding layer 170 and the first extended ground lines 121b and/or the adhesive strength between the EMI shielding layer 170 and the insulation layer 111 is relatively low, a total adhesive strength of the EMI shielding layer 170 may be improved. In other words, a higher adhesive strength between EMI shielding layer 170 and one material may compensate for a lower adhesive strength between the EMI shielding layer 170 and another material. Furthermore, because the plurality of first extended ground lines 121b are in contact with the EMI shielding layer 170, a total contact area between the EMI shielding layer 170 and the first extended ground lines 121b may be sufficient to obtain an excellent or desired electrical contact resistance value between the EMI shielding layer 170 and the first extended ground lines 121b.

In some embodiments, a second ground line 122 may be disposed in the substrate 110. A plurality of power lines and signal lines (not shown) may be disposed in the substrate 110. The second ground line 122 may be electrically connected to the first ground line 121 through first via contact plugs 131. Outer sidewalls of the second ground line 122 may be exposed at the sidewalls of the substrate 110. The first and second ground lines 121 and 122 may function as paths for providing a ground path to the chips 141 and 142 and the EMI shielding layer 170. In some embodiments, the second ground line 122 is not included in the semiconductor package 100.

Figure 3:
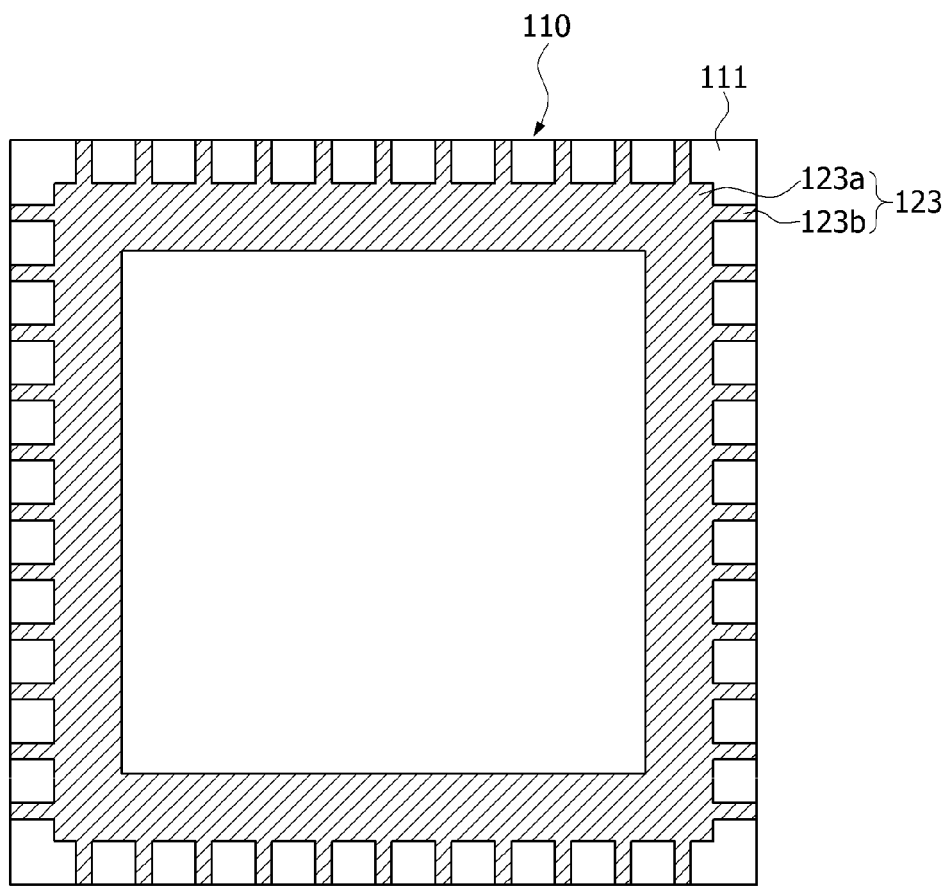
FIG. 3 is a layout diagram illustrating a third ground line included in the semiconductor package of FIG. 1.

In some embodiments, a third ground line 123 may be disposed on a bottom surface of the substrate 110 that is opposite to the chips 141 and 142. Although not shown in the drawings, a plurality of power lines and signal lines may be disposed on the bottom surface of the substrate 110. The third ground line 123 may be electrically connected to the second ground line 122 through second via contact plugs 132. As illustrated in FIG. 3, the third ground line 123 may include a third internal ground line 123a disposed on the bottom surface of the substrate 110 along edges of the substrate 110 and third extended ground lines 123b extending from the third internal ground line 123a toward sidewalls of the substrate 110. In some embodiments, the third internal ground line 123a and the third extended ground lines 123b may include a copper material. In the present embodiment, the third internal ground line 123a may have a rectangular closed loop shape in a plan view. The third internal ground line 123a may be configured in a variety of different shapes or geometries. For example, in some embodiments, the third internal ground line 123a may have an open loop shape in a plan view.

Although not shown in the drawings, another internal ground line may be additionally disposed on the bottom surface of the substrate 110 and surrounded by the third internal ground line 123a. The third extended ground lines 123b may extend from the third internal ground line 123a toward the sidewalls of the substrate 110, such that ends of the third extended ground lines 123b are exposed at the sidewalls of the substrate 110. The number of the third extended ground lines 123b may be at least two, and the third extended ground lines 123b may be arranged along the edges of the substrate 110 such that they are uniformly or non-uniformly spaced apart from each other by a predetermined distance or distances.

In some embodiments, the insulation layer 111 and the third extended ground lines 123b may be arranged to alternate along the sidewalls of the substrate 110. In addition, the insulation layer 111 and the third extended ground lines 123b may be arranged to alternate along edges of the bottom surface of the substrate 110.

A solder resist layer 180 may be disposed on the bottom surface of the substrate 110. Although not shown in the drawings, openings for external connection may be formed in the solder resist layer 180. A top surface of the solder resist layer 180 may be attached to the bottom surface of the substrate 110 and a bottom surface of the third ground line 123. For example, the solder resist layer 180 may be attached to the insulation layer 111 and the third extended ground lines 123b, which are arranged to alternate along the edges of the substrate 110. Thus, although an adhesive strength between the solder resist layer 180 and the third extended ground lines 123b is lower than an adhesive strength between the solder resist layer 180 and the substrate 110, a total adhesive strength of the solder resist layer 180 may be improved or enhanced due to the high adhesive strength between the solder resist layer 180 and the insulation layer 111.

Figure 4:
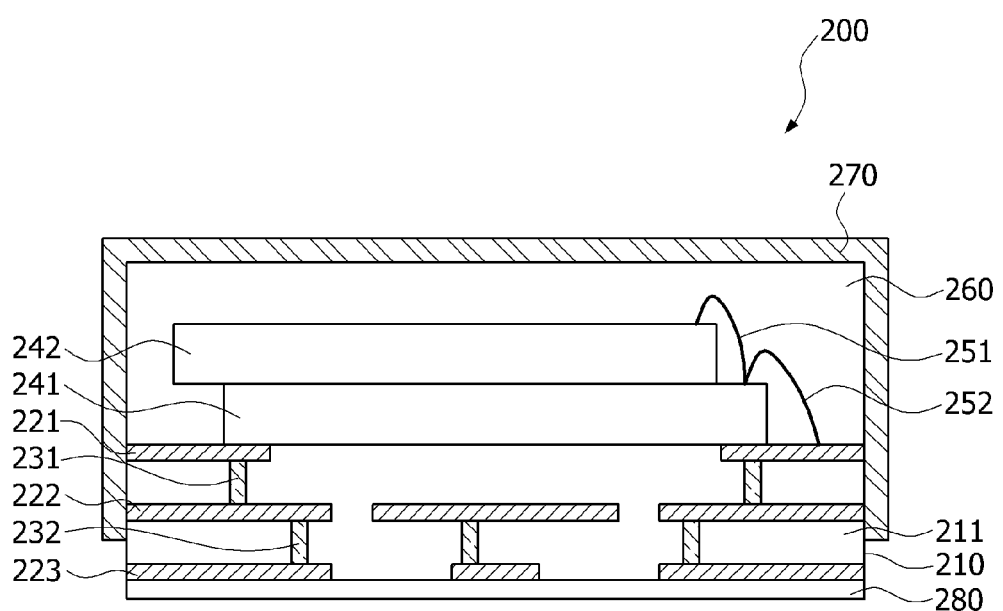
FIG. 4 is a cross-sectional view illustrating a semiconductor package according to another embodiment of the present disclosure.

Referring to FIG. 4, a semiconductor package 200 according to another embodiment may include a substrate 210, chips 241 and 242 on the substrate 210, and a molding member 260 covering the chips 241 and 242. The substrate 210 may include an insulation layer 211. Although FIG. 4 illustrates two chips 241 and 242 disposed on the substrate 210, some embodiments may include a single chip, at least three chips, or other numbers of chips disposed on the substrate 210.

When at least two chips are disposed on the substrate 210, the at least two chips may be vertically stacked on the substrate 210, and/or may be laterally arranged on the substrate 210. In the present embodiment, the lower chip 241 and the upper chip 242 may be electrically connected to each other through first wires 251, and the lower chip 241 and the substrate 210 may be electrically connected to each other through second wires 252. In some embodiments, the lower and upper chip 241 and 242 may be flip chips. In some embodiments, the lower and upper chips 241 and 242 may be electrically connected to the substrate 210 without use of the first and second wires 251 and 252.

In some embodiments, a top surface of the substrate 210, the lower and upper chips 241 and 242, and the first and second wires 251 and 252 may be covered with the molding member 260. In some embodiments, the molding member 260 may be an epoxy molding compound (EMC) material. Sidewalls of the molding member 260 may be vertically aligned with sidewalls of the substrate 210.

Figure 5:
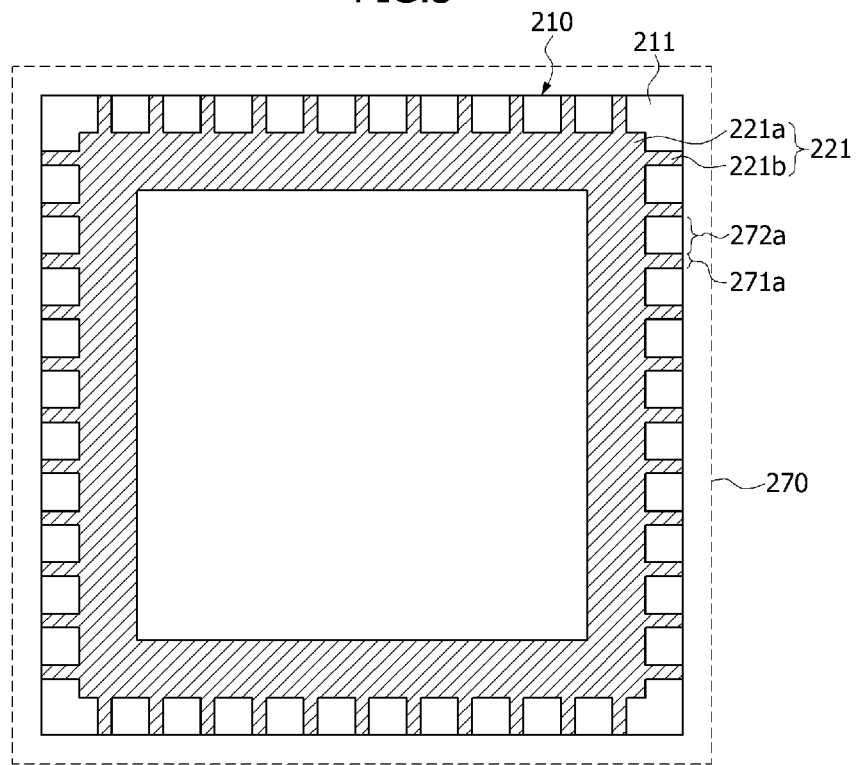
FIG. 5 is a layout diagram illustrating a first ground line included in the semiconductor package of FIG. 4.

A first ground line 221 may be disposed on a top surface of the substrate 210. Although not shown in the drawings, a plurality of power lines and signal lines may be disposed on the top surface of the substrate 210. As illustrated in FIG. 5, the first ground line 221 may include a first internal ground line 221a disposed on the top surface of the substrate 210 along edges of the substrate 210 and first extended ground lines 221b extending from the first internal ground line 221a toward sidewalls of the substrate 210. In some embodiments, the first internal ground line 221a and the first extended ground lines 221b may include a copper material. In the present embodiment, the first internal ground line 221a may have a rectangular closed loop shape in a plan view. The first internal ground line 221a may be configured in a variety of different shapes or geometries. For example, in some embodiments, the first internal ground line 221a may have an open loop shape in a plan view. Although not shown in the drawings, another internal ground line may be additionally disposed on the top surface of the substrate 210 and surrounded by the first internal ground line 221a.

The first extended ground lines 221b may extend from the first internal ground line 221a toward the sidewalls of the substrate 210 such that ends of the first extended ground lines 221b are exposed at the sidewalls of the substrate 210. The number of the first extended ground lines 221b may be at least two, and the first extended ground lines 221b may be arranged along the edges of the substrate 210 such that they are uniformly or non-uniformly spaced apart from each other by a predetermined distance or distances. In some embodiments, the insulation layer 211 and the first extended ground lines 221b may be arranged to alternate along the edges of the substrate 210.

Figure 6:
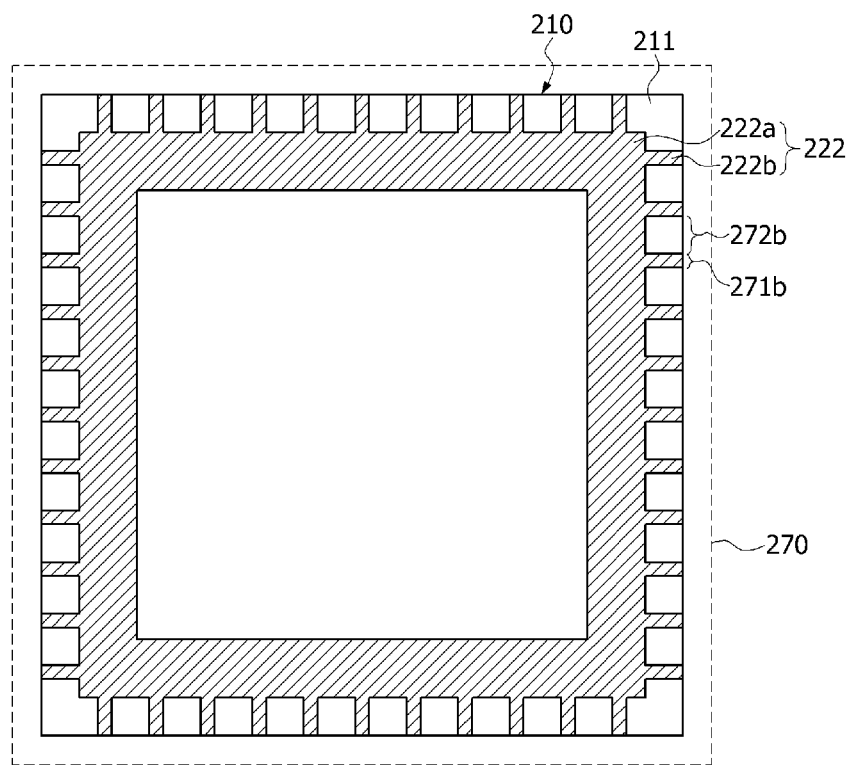
FIG. 6 is a layout diagram illustrating a second ground line included in the semiconductor package of FIG. 4.

A second ground line 222 may be disposed in the substrate 210. A plurality of power lines and signal lines (not shown) may be disposed in the substrate 210. The second ground line 222 may be electrically connected to the first ground line 221 through first via contact plugs 231. The second ground line 222 may overlap with the first ground line 221 when viewed from a plan view. As illustrated in FIG. 6, the second ground line 222 may include a second internal ground line 222a disposed in the substrate 210 along edges of the substrate 210 and second extended ground lines 222b extending from the second internal ground line 222a toward the sidewalls of the substrate 210. In some embodiments, the second internal ground line 222a and the second extended ground lines 222b may include or be formed of a copper material.

In the present embodiment, the second internal ground line 222a may have a rectangular closed loop shape in a plan view. The second internal ground line 222a may be configured in a variety of different shapes or geometries. For example, in some embodiments, the second internal ground line 222a may have an open loop shape in a plan view. Although not shown in the drawings, another second internal ground line may be additionally disposed in the substrate 210 surrounded by the second internal ground line 222a. The second extended ground lines 222b may extend from the second internal ground line 222a toward the sidewalls of the substrate 210 such that ends of the second extended ground lines 222b are exposed at the sidewalls of the substrate 210. The number of the second extended ground lines 222b may be at least two, and the second extended ground lines 222b may be arranged along the edges of the substrate 210 such that they are uniformly or non-uniformly spaced apart from each other by a predetermined distance or distances. In some embodiments, the insulation layer 211 and the second extended ground lines 222b may be arranged to alternate along the sidewalls of the substrate 210.

The EMI shielding layer 270 may be disposed on a top surface and sidewalls of the molding member 260, and may extend onto or along the sidewalls of the substrate 210 by a predetermined length. In some embodiments, the EMI shielding layer 270 may include at least one metal layer. A portion of the EMI shielding layer 270 extending onto or along the sidewalls of the substrate 210 may contact the insulation layer 211 and the first extended ground lines 221b, which are arranged to alternate along the sidewalls of the substrate 210. Thus, the EMI shielding layer 270 may contact end portions 271a of the first extended ground lines 221b and exposed portions 272a of the insulation layer 211 which are arranged to alternate along the sidewalls of the substrate 210, as illustrated in FIG. 5.

The portion of the EMI shielding layer 270 extending onto or along the sidewalls of the substrate 210 may also contact the insulation layer 211 and the second extended ground lines 222b, which are arranged to alternate along the sidewalls of the substrate 210. Thus, the EMI shielding layer 270 may contact end portions 271b of the second extended ground lines 222b and exposed portions 272b of the insulation layer 211 which are arranged to alternate along the sidewalls of the substrate 210, as illustrated in FIG. 6.

In some embodiments, an adhesive strength between the EMI shielding layer 270 and the first and second extended ground lines 221b and 222b may be different from an adhesive strength between the EMI shielding layer 270 and the insulation layer 211. However, according to the present embodiment, the EMI shielding layer 270 may alternately contact the end portions 271a of the first extended ground lines 221b and the exposed portions 272a of the insulation layer 211, and/or may alternately contact the end portions 271b of the second extended ground lines 222b and the exposed portions 272b of the insulation layer 211, as described herein. Thus, a total adhesive strength of the EMI shielding layer 270 may be improved, although the adhesive strength between the EMI shielding layer 270 and the first and second extended ground lines 221b and 222b and the adhesive strength between the EMI shielding layer 270 and the insulation layer 211 is relatively low. Because the plurality of first and second extended ground lines 221b and 222b are in contact with the EMI shielding layer 270, a total contact area between the EMI shielding layer 270 and the first and second extended ground lines 221b and 222b may be sufficient to obtain an excellent or desired electrical contact resistance value between the EMI shielding layer 270 and the ground lines 221 an 222.

Figure 7:
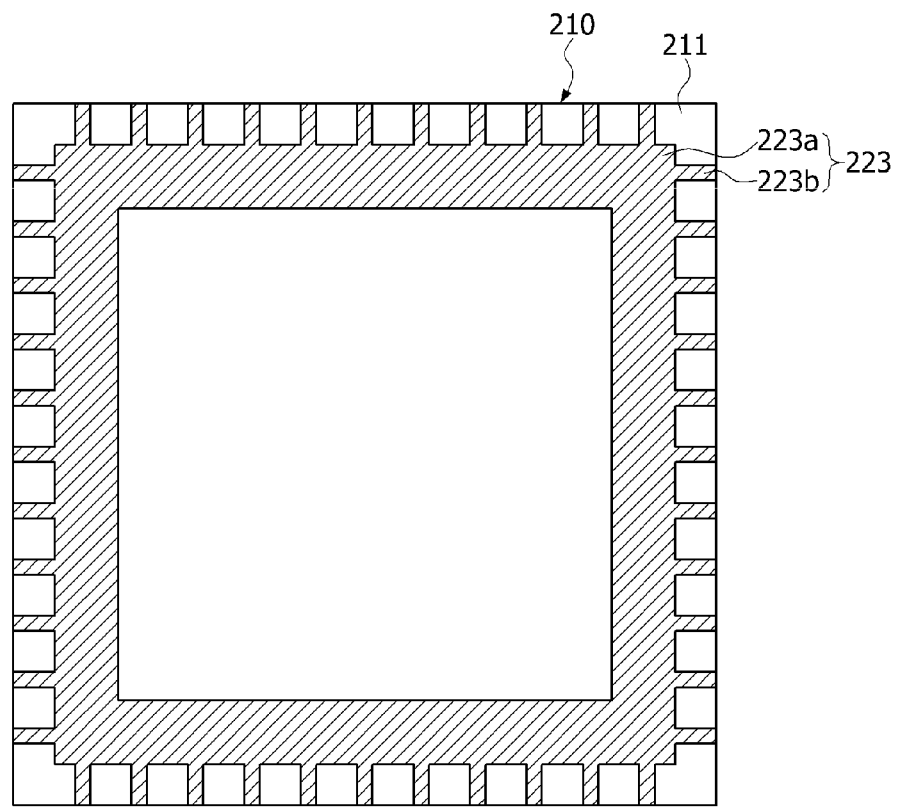
FIG. 7 is a layout diagram illustrating a third ground line included in the semiconductor package of FIG. 4.

In some embodiments, a third ground line 223 may be disposed on a bottom surface of the substrate 210 that is opposite to the chips 241 and 242. A plurality of power lines and signal lines (not shown) may be disposed on the bottom surface of the substrate 110. The third ground line 223 may be electrically connected to the second ground line 122 through second via contact plugs 232. As illustrated in FIG. 7, the third ground line 223 may include a third internal ground line 223a disposed on the bottom surface of the substrate 210 along edges of the substrate 210 and third extended ground lines 223b extending from the third internal ground line 223a toward sidewalls of the substrate 210. In some embodiments, the third internal ground line 223a and the third extended ground lines 223b may include a copper material.

In the present embodiment, the third internal ground line 223a may have a rectangular closed loop shape in a plan view. The third internal ground line 223a may be configured in a variety of different shapes or geometries. For example, in some embodiments, the third internal ground line 223a may have an open loop shape in a plan view. Although not shown in the drawings, another internal ground line may be additionally disposed on the bottom surface of the substrate 210 and surrounded by the third internal ground line 223a. The third extended ground lines 223b may extend from the third internal ground line 223a toward the sidewalls of the substrate 210, such that ends of the third extended ground lines 223b are exposed at the sidewalls of the substrate 210. The number of the third extended ground lines 223b may be at least two, and the third extended ground lines 223b may be arranged along the edges of the substrate 210 such that they are uniformly or non-uniformly spaced apart from each other by a predetermined distance or distances.

In some embodiments, the insulation layer 211 and the third extended ground lines 223b may be arranged to alternate along the sidewalls of the substrate 210. In addition, the insulation layer 211 and the third extended ground lines 223b may be arranged to alternate along edges of the bottom surface of the substrate 210.

A solder resist layer 280 may be disposed on the bottom surface of the substrate 210. Although not shown in the drawings, openings for external connection may be formed in the solder resist layer 180. A top surface of the solder resist layer 280 may be attached to the bottom surface of the substrate 210 and a bottom surface of the third ground line 223. For example, the solder resist layer 280 may be attached to the insulation layer 211 and the third extended ground lines 223b, which are arranged to alternate along the edges of the substrate 210. Thus, even when an adhesive strength between the solder resist layer 280 and the third extended ground lines 223b is lower than an adhesive strength between the solder resist layer 280 and the substrate 210, a total adhesive strength of the solder resist layer 280 may be improved or enhanced due to the high adhesive strength between the solder resist layer 280 and the insulation layer 211. Accordingly, embodiments may provide two different adhesive surfaces for two different materials to adhere to an EMI shielding layer 270 and a solder resist layer 280.

Figure 8:
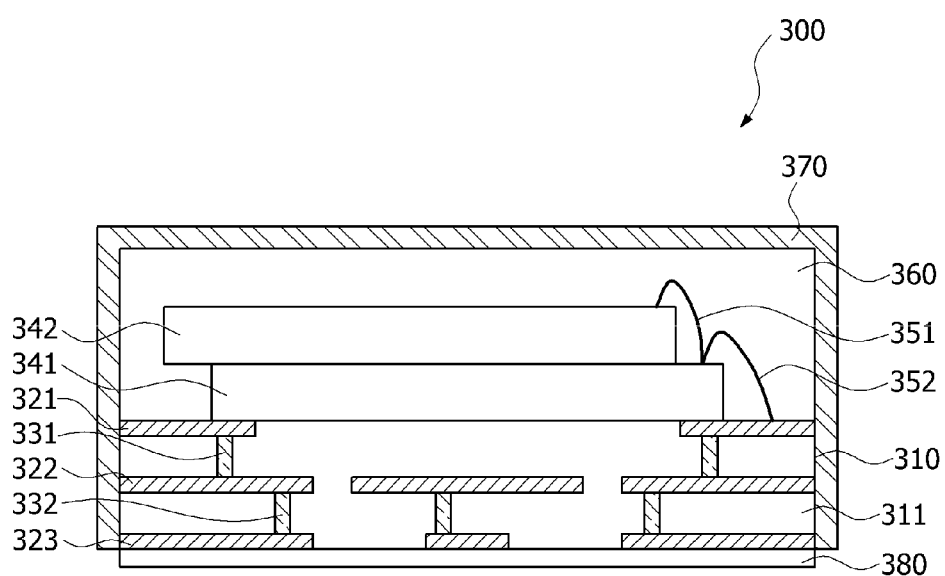
FIG. 8 is a cross-sectional view illustrating a semiconductor package according to another embodiment of the present disclosure.

Referring to FIG. 8, a semiconductor package 300 according to another embodiment may include a substrate 310, chips 341 and 342 on the substrate 310, and a molding member 360 covering the chips 341 and 342. The substrate 310 may include an insulation layer 311. Although FIG. 8 illustrates an example in which only two chips 341 and 342 are disposed on the substrate 310, some embodiments may include a single chip, at least three chips, or any number of chips disposed on the substrate 310.

When at least two chips are disposed on the substrate 310, the at least two chips may be vertically stacked on the substrate 310, or may be laterally arranged on the substrate 310. In the present embodiment, the lower chip 341 and the upper chip 342 may be electrically connected to each other through first wires 351, and the lower chip 341 and the substrate 310 may be electrically connected to each other through second wires 352. In some embodiments, the lower and upper chip 341 and 342 may be flip chips. In some embodiments, the lower and upper chips 341 and 342 may be electrically connected to the substrate 310 without use of the first and second wires 351 and 352. A top surface of the substrate 310, the lower and upper chips 341 and 342, and the first and second wires 351 and 352 may be covered with the molding member 360. In some embodiments, the molding member 360 may be an epoxy molding compound (EMC) material. Sidewalls of the molding member 360 may be vertically aligned with sidewalls of the substrate 310.

Figure 9:
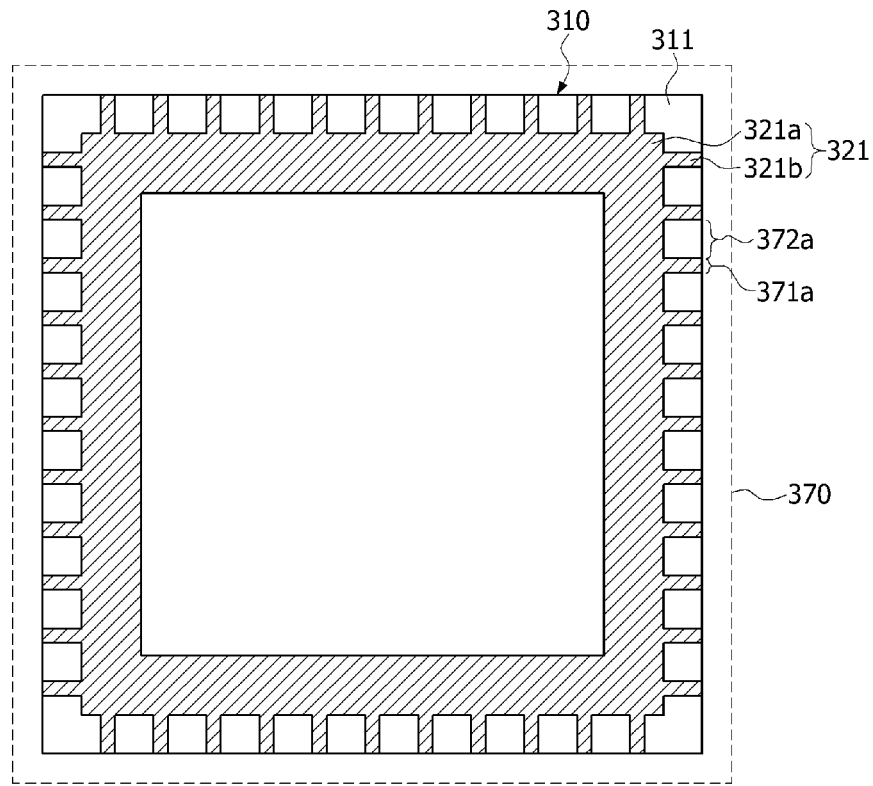
FIG. 9 is a layout diagram illustrating a first ground line included in the semiconductor package of FIG. 8.

A first ground line 321 may be disposed on a top surface of the substrate 310. Although not shown in the drawings, a plurality of power lines and signal lines may be disposed on the top surface of the substrate 310. As illustrated in FIG. 9, the first ground line 321 may include a first internal ground line 321a disposed on the top surface of the substrate 310 along edges of the substrate 310 and first extended ground lines 321b extending from the first internal ground line 321a toward sidewalls of the substrate 310. In some embodiments, the first internal ground line 321a and the first extended ground lines 321b may include a copper material.

In the present embodiment, the first internal ground line 321a may have a rectangular closed loop shape in a plan view. The first internal ground line 321a may be configured in a variety of different shapes or geometries. For example, in some embodiments, the first internal ground line 321a may have an open loop shape in a plan view. Although not shown in the drawings, another internal ground line may be additionally disposed on the top surface of the substrate 310 and surrounded by the first internal ground line 321a. The first extended ground lines 321b may extend from the first internal ground line 321a toward the sidewalls of the substrate 310, such that ends of the first extended ground lines 321b are exposed at the sidewalls of the substrate 310. The number of the first extended ground lines 321b may be at least two, and the first extended ground lines 321b may be arranged along the edges of the substrate 310 such that they are uniformly or non-uniformly spaced apart from each other by a predetermined distance or distances. In some embodiments, the insulation layer 311 and the first extended ground lines 321b may be arranged to alternate along the sidewalls of the substrate 310.

Figure 10:
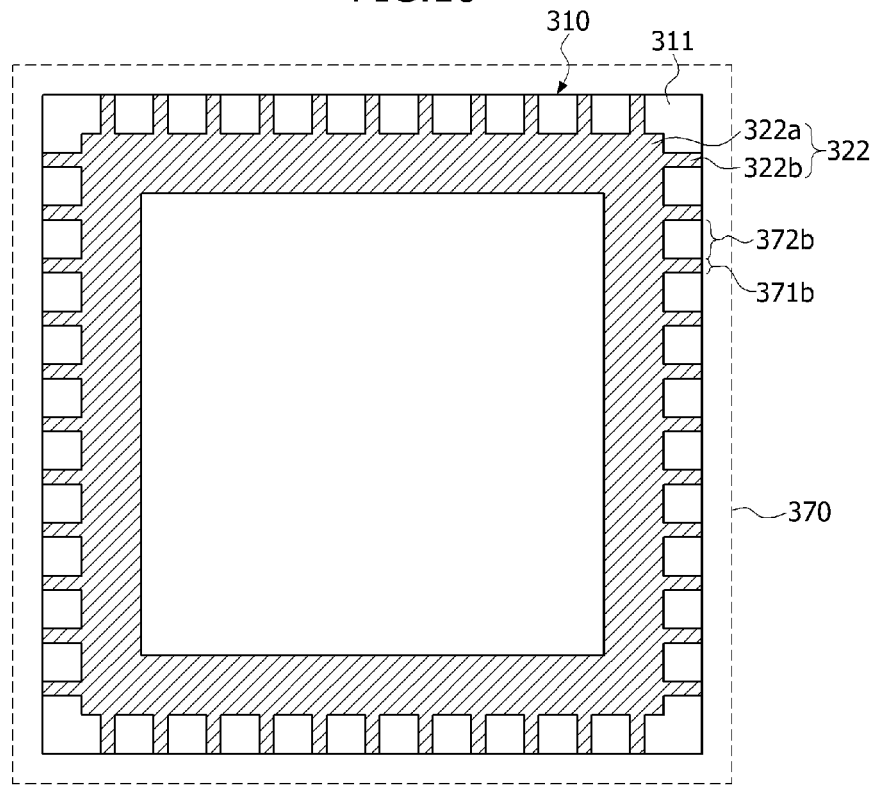
FIG. 10 is a layout diagram illustrating a second ground line included in the semiconductor package of FIG. 8.

A second ground line 322 may be disposed in the substrate 310. The second ground line 322 may be electrically connected to the first ground line 321 through first via contact plugs 331. A plurality of power lines and signal lines (not shown) may be disposed in the substrate 310. The second ground line 322 may overlap with the first ground line 321 when viewed from a plan view. As illustrated in FIG. 10, the second ground line 322 may include a second internal ground line 322a disposed in the substrate 310 along edges of the substrate 310 and second extended ground lines 322b extending from the second internal ground line 322a toward the sidewalls of the substrate 310. In some embodiments, the second internal ground line 322a and the second extended ground lines 322b may include a copper material.

In the present embodiment, the second internal ground line 322a may have a rectangular closed loop shape in a plan view. The second internal ground line 222a may be configured in a variety of different shapes or geometries For example, in some embodiments, the second internal ground line 322a may have an open loop shape in a plan view. Although not shown in the drawings, another internal ground line may be additionally disposed in the substrate 310 and surrounded by the second internal ground line 322a. The second extended ground lines 322b may extend from the second internal ground line 322a toward the sidewalls of the substrate 310, such that ends of the second extended ground lines 322b are exposed at the sidewalls of the substrate 310. The number of the second extended ground lines 322b may be at least two, and the second extended ground lines 322b may be arranged along the edges of the substrate 310 such that they are uniformly or non-uniformly spaced apart from each other by a predetermined distance or distances. In some embodiments, the insulation layer 311 and the second extended ground lines 322b may be arranged to alternate along the sidewalls of the substrate 310.

Figure 11:
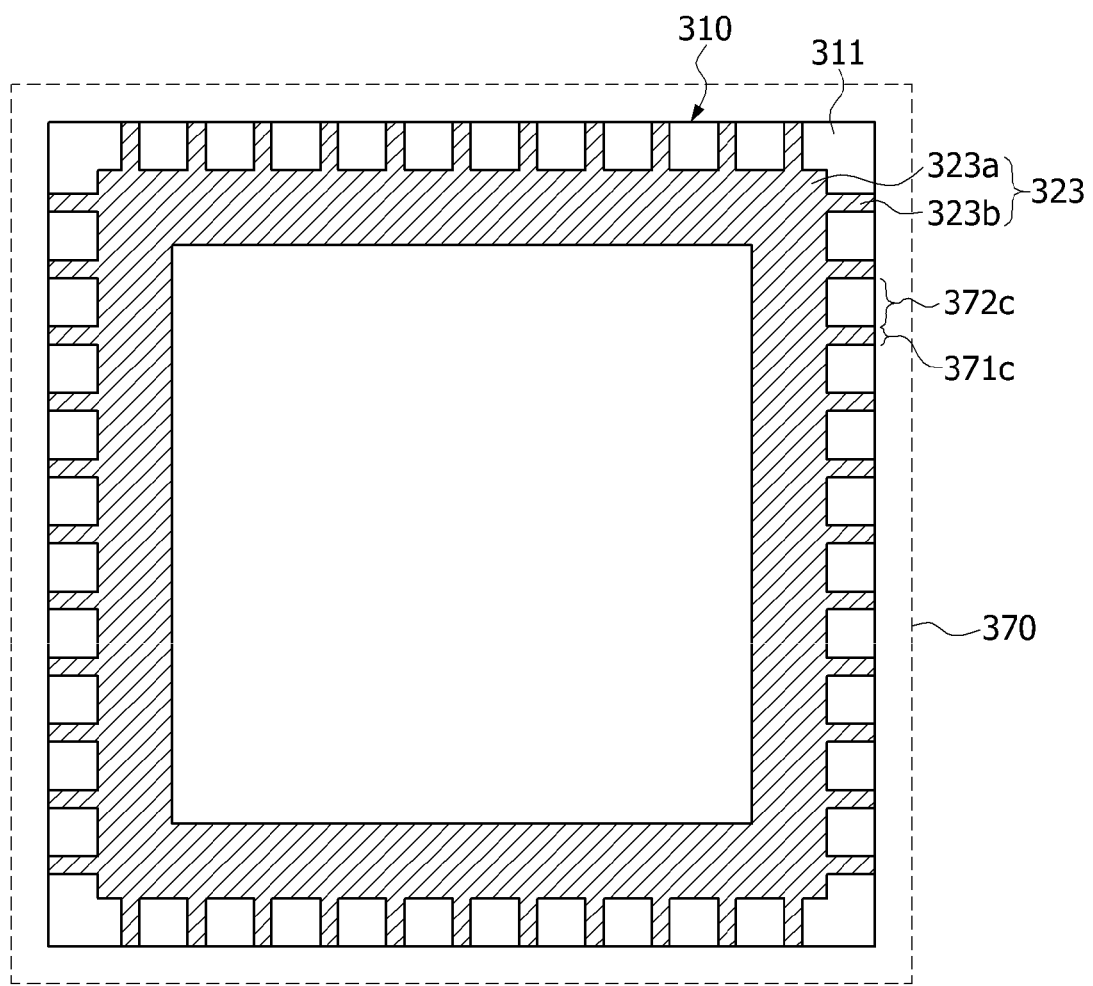
FIG. 11 is a layout diagram illustrating a third ground line included in the semiconductor package of FIG. 8.

A third ground line 323 may be disposed on a bottom surface of the substrate 310 opposite to the chips 341 and 342. Although not shown in the drawings, a plurality of power lines and signal lines may be disposed on the bottom surface of the substrate 310. The third ground line 323 may be electrically connected to the second ground line 322 through second via contact plugs 332. As illustrated in FIG. 11, the third ground line 323 may include a third internal ground line 323a disposed on the bottom surface of the substrate 310 along edges of the substrate 310 and third extended ground lines 323b extending from the third internal ground line 323a toward sidewalls of the substrate 310. In some embodiments, the third internal ground line 323a and the third extended ground lines 323b may include a copper material.

In the present embodiment, the third internal ground line 323a may have a rectangular closed loop shape in a plan view. The third internal ground line 323a may be configured in a variety of different shapes or geometries. For example, in some embodiments, the third internal ground line 323a may have an open loop shape in a plan view. Although not shown in the drawings, another internal ground line may be additionally disposed on the bottom surface of the substrate 310 and surrounded by the third internal ground line 323a. The third extended ground lines 323b may extend from the third internal ground line 323a toward the sidewalls of the substrate 310, such that ends of the third extended ground lines 323b are exposed at the sidewalls of the substrate 310. The number of the third extended ground lines 323b may be at least two, and the third extended ground lines 323b may be arranged along the edges of the substrate 310 such that they are uniformly or non-uniformly spaced apart from each other by a predetermined distance or distances. In some embodiments, the insulation layer 311 and the third extended ground lines 323b may be arranged to alternate along the sidewalls of the substrate 310. In addition, the insulation layer 311 and the third extended ground lines 323b may be arranged to alternate along edges of the bottom surface of the substrate 310.

The EMI shielding layer 370 may be disposed on a top surface and along or proximate to sidewalls of the molding member 360, and may extend to cover the entire surface of the sidewalls of the substrate 310. In some embodiments, the EMI shielding layer 370 may include at least one metal layer. An upper portion of the EMI shielding layer 370 extending onto or along the sidewalls of the substrate 310 may contact the insulation layer 311 and the first extended ground lines 321b, which are arranged to alternate along the sidewalls of the substrate 310. Thus, the EMI shielding layer 370 may contact end portions 371a of the first extended ground lines 321b and exposed portions 372a of the insulation layer 311 which are arranged to alternate along the upper sidewalls of the substrate 310, as illustrated in FIG. 9.

A middle portion of the EMI shielding layer 370 extending onto or along the sidewalls of the substrate 310 may also contact the insulation layer 311 and the second extended ground lines 322b, which are arranged to alternate along the sidewalls of the substrate 310. Thus, the EMI shielding layer 370 may contact end portions 371b of the second extended ground lines 322b and exposed portions 372b of the insulation layer 311 which are arranged to alternate along the middle sidewalls of the substrate 310, as illustrated in FIG. 10.

A lower portion of the EMI shielding layer 370 extending onto or along the sidewalls of the substrate 310 may also contact the insulation layer 311 and the third extended ground lines 323b, which are arranged to alternate along the sidewalls of the substrate 310. Thus, the EMI shielding layer 370 may contact end portions 371c of the third extended ground lines 323b and exposed portions 372c of the insulation layer 311 which are arranged to alternate along the lower sidewalls of the substrate 310, as illustrated in FIG. 11.

In some embodiments, an adhesive strength between the EMI shielding layer 370 and the first to third extended ground lines 321b, 322b and 323b may be different from an adhesive strength between the EMI shielding layer 370 and the insulation layer 311. However, according to the present embodiment, the EMI shielding layer 370 may alternately contact the end portions 371a of the first extended ground lines 321b and the exposed portions 372a of the insulation layer 311 along the upper sidewalls of the substrate 310, and may alternately contact the end portions 371b of the second extended ground lines 322b and the exposed portions 372b of the insulation regions 311 along the middle sidewalls of the substrate 310. In addition, the EMI shielding layer 370 may alternately contact the end portions 371c of the third extended ground lines 323b and the exposed portions 372c of the insulation layer 311 along the lower sidewalls of the substrate 310. Thus, a total adhesive strength of the EMI shielding layer 370 may be improved or enhanced, although the adhesive strength between the EMI shielding layer 370 and the first to third extended ground lines 321b, 322b and 323b, and the adhesive strength between the EMI shielding layer 370 and the insulation layer 311 is relatively low. Therefore, because the plurality of first to third extended ground lines 321b, 322b and 323b are in contact with the EMI shielding layer 370, a total contact area between the EMI shielding layer 370 and the first to third extended ground lines 321b, 322b and 323b may be sufficient to obtain an excellent or desired electrical contact resistance value between the EMI shielding layer 370 and the first to third ground lines 321, 322 and 323.

A solder resist layer 380 may be disposed on the bottom surface of the substrate 310. Although not shown in the drawings, openings for external connection may be formed in the solder resist layer 380. A top surface of the solder resist layer 380 may be attached to the bottom surface of the substrate 310 and a bottom surface of the third ground line 323. For example, the solder resist layer 380 may be attached to the insulation layer 311 and the third extended ground lines 323b, which are arranged to alternate along the edges of the substrate 310. Thus, even though an adhesive strength between the solder resist layer 380 and the third extended ground lines 323b is lower than an adhesive strength between the solder resist layer 380 and the substrate 310, a total adhesive strength of the solder resist layer 380 may be improved or enhanced due to the high adhesive strength between the solder resist layer 380 and the insulation layer 311.

Figure 12:
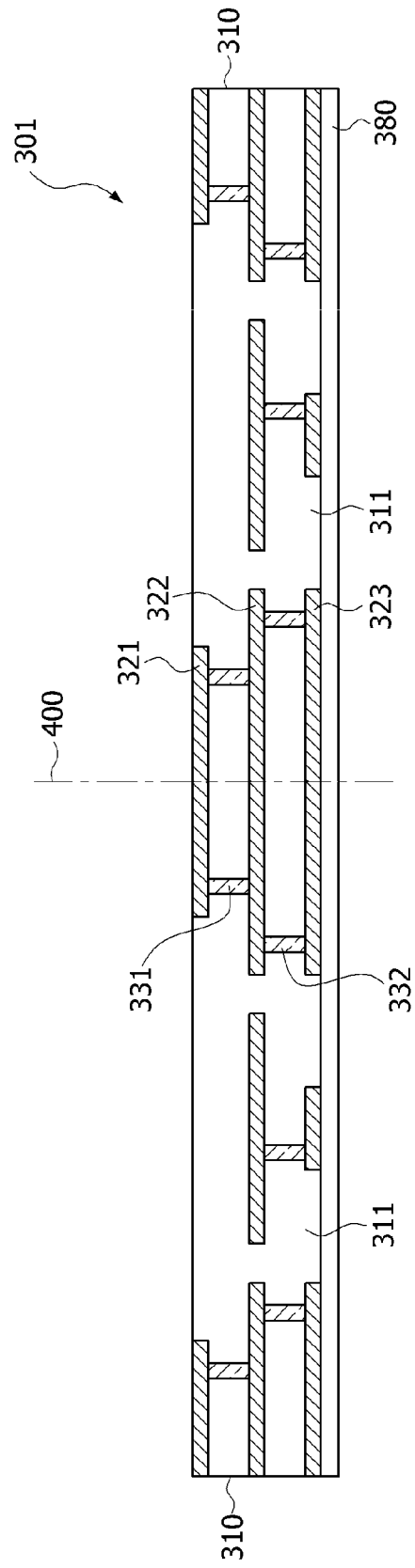
FIGS. 12, 14, 15 and 16 are cross-sectional views illustrating a method of fabricating a semiconductor package according to some embodiments of the present disclosure.
Figure 13:
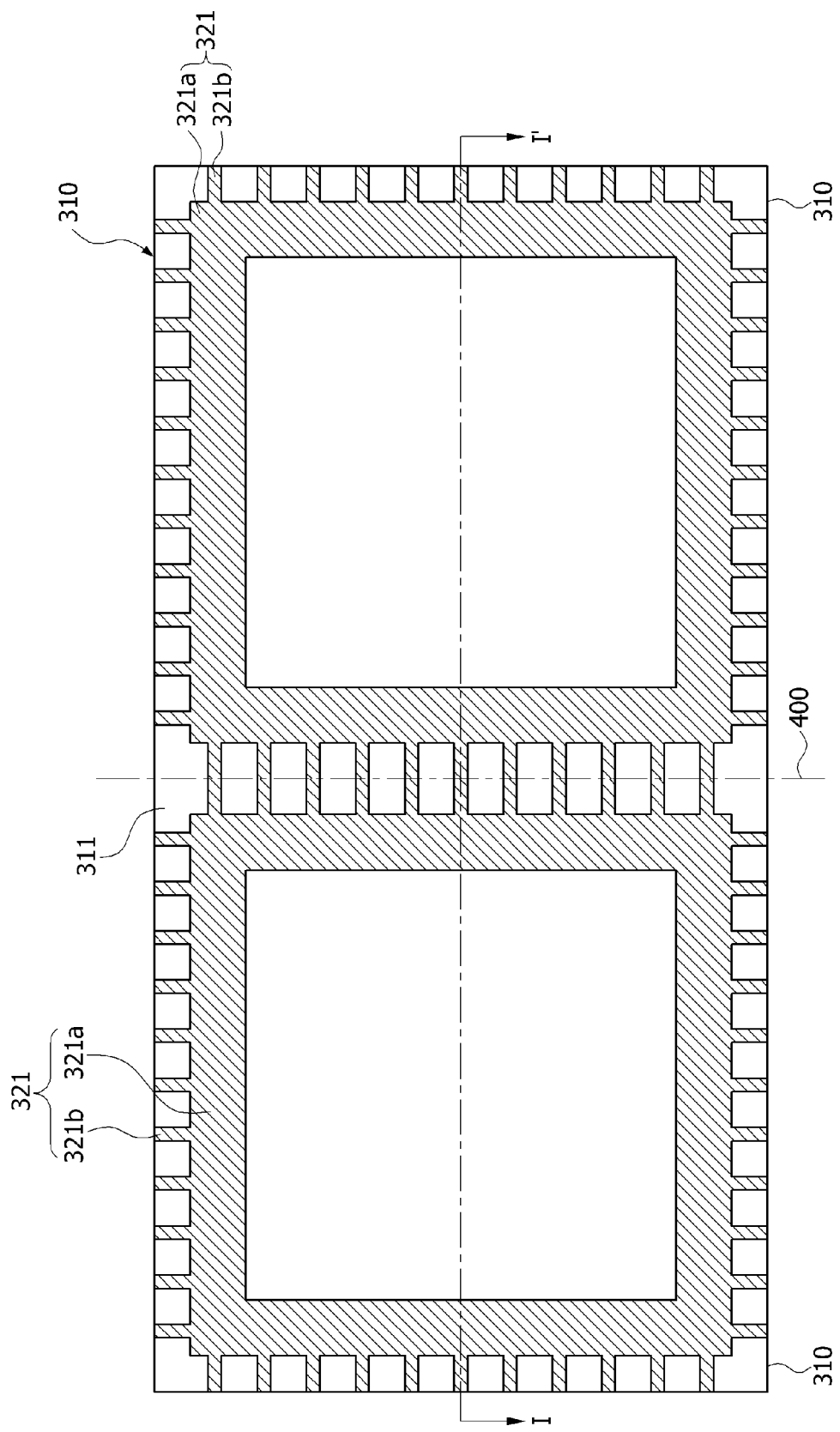
FIG. 13 is a layout diagram illustrating a method of fabricating a semiconductor package according to some embodiments of the present disclosure.

FIGS. 12, 14, 15 and 16 are cross-sectional views illustrating, in some embodiments, a method of fabricating a semiconductor package and FIG. 13 is a layout diagram illustrating, in some embodiments, a method of fabricating a semiconductor package. FIG. 12 is a cross sectional view taken along a line I-I' of FIG. 13. Referring to FIG. 12, a substrate strip 301 may be provided. The substrate strip 301 may include a plurality of substrates 310, which are delineated by a cutting line 400 indicated by a dotted line in the figures. The substrate strip 301 may include an insulation layer 311. Each of the substrates 310 may include a first ground line 321, a second ground line 322, and a third ground line 323. The first ground lines 321 may be disposed on top surfaces of the substrates 310. The second ground lines 322 may be disposed in one of the substrates 310. The third ground lines 323 may be disposed on or in bottom surfaces of the substrates 310. In each substrate 310, the first ground line 321 and the second ground line 322 may be electrically connected to each other through first via contact plugs 331 and the second ground line 322 and the third ground line 323 may be electrically connected to each other through second via contact plugs 332. A solder resist layer 380 may be formed on a bottom surface of the substrate strip 301 to cover the third ground lines 323.

Referring to FIG. 13, each substrate 310 may include the first ground line 321, and the first ground line 321 may be formed to include a first internal ground line 321a and first extended ground lines 321b. The first internal ground line 321a may be formed to have a closed loop shape or an open loop shape, which is disposed along edges of each substrate 310. In each substrate 310, the first extended ground lines 321b may be formed to extend from the first internal ground line 321a toward sidewalls of the substrate 310. The first internal ground lines 321a of a pair of immediately adjacent or proximate substrates 310 may be physically connected to each other by the first extended ground lines 321b located or disposed between the substrates 310. The cutting line 400 may cross central portions of the first extended ground lines 321b that connect the first internal ground lines 321a of the pair of immediately adjacent substrates 310 to each other. The second ground line 322 and the third ground line 323 may be formed to have a similar structure to the first ground line 321. In particular, the second and third extended ground lines 322b and 323b may be formed in substantially similar configurations as the first extended ground lines 321b along edges of each substrate 310.

Figure 14:
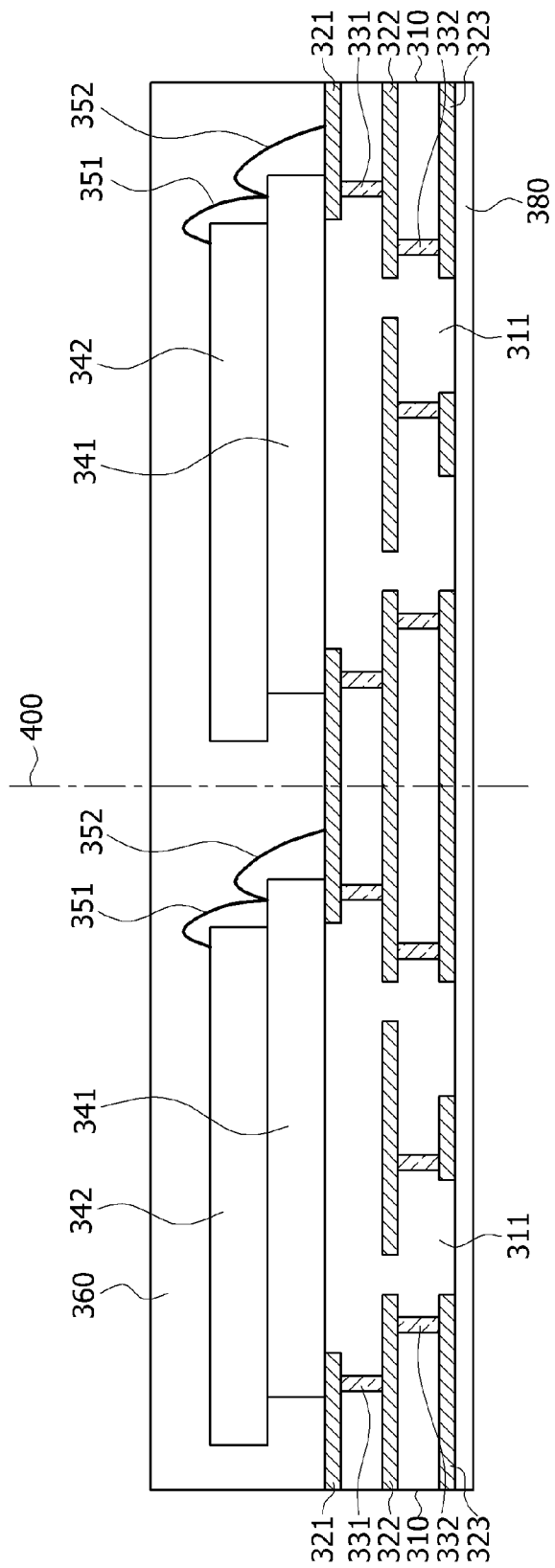

Referring to FIG. 14, a lower chip 341 and an upper chip 342 may be mounted or disposed on a top surface of each substrate 310. Subsequently, first and second wires 351 and 352 may be formed to electrically connect the lower and upper chips 341 and 342 and the substrates 310 to each other, although other electrical connections between the lower and upper chips 341 and 342 and the substrates 310 may be formed. In some embodiments, the lower and second chips 341 and 342 may be mounted on the substrates 310 in the form of flip chips. In some embodiments, the lower and upper chips 341 and 342 may be electrically connected to the substrates 310 without use of the first and second wires 351 and 352. A molding layer 360 may be formed on a top surface of the substrates 310 to cover the lower and upper chips 341 and 342 and the first and second wires 351 and 352. In some embodiments, the molding layer 360 may be formed of an epoxy molding compound (EMC) material.

Figure 15:
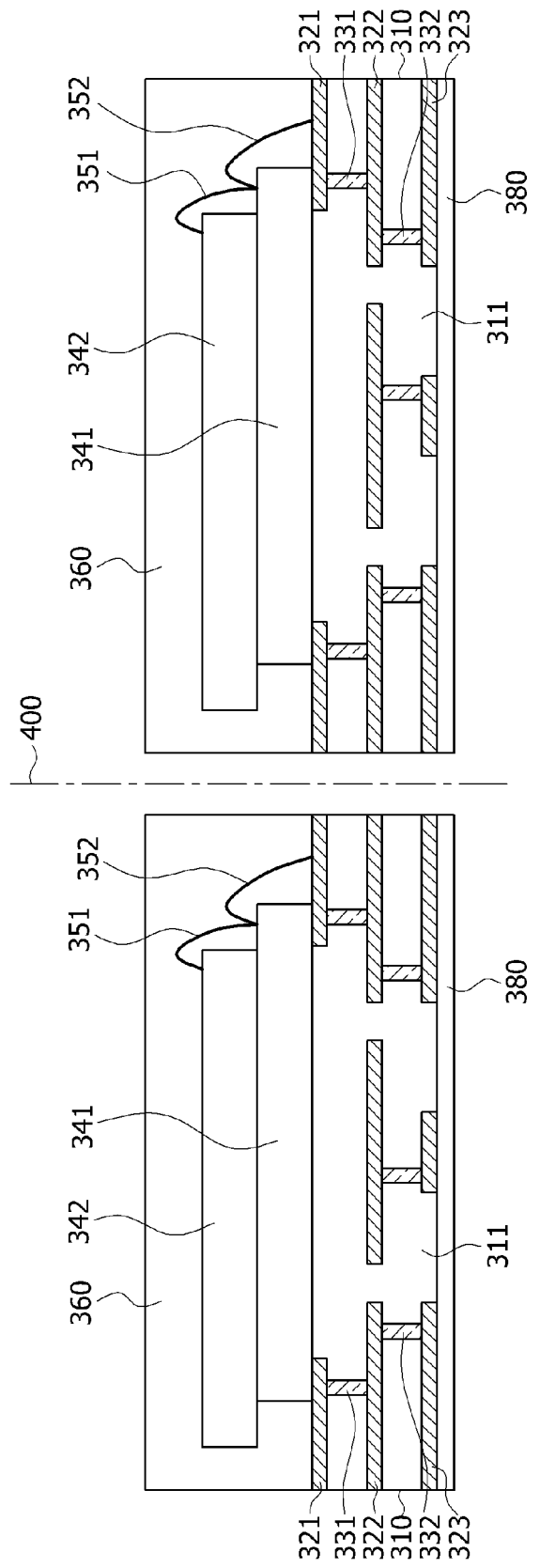

Referring to FIG. 15, a sawing or cutting process may be performed along the cutting line 400 to separate the substrates 310 from each other. The sawing process may also separate the molding layer 360 into a plurality of molding members. As a result of the sawing process, end portions of the first, second and third extended ground lines 321b, 322b and 323b may be exposed at sidewalls of the separate substrates 310. For example, as described with reference to FIGS. 9, 10 and 11, the first extended ground lines 321b and portions of the substrate 310 may be alternately exposed along upper sidewalls of each of the separate substrates 310, the second extended ground lines 322b and portions of the substrate 310 may be alternately exposed along middle sidewalls of each of the separate substrates 310, and the third extended ground lines 323b and portions of the substrate 310 may be alternately exposed along lower sidewalls of each of the separate substrates 310.

The sawing process may also separate the solder resist layer 380 into a plurality of patterns. When the solder resist layer 380 contacts only the third ground lines 323 along edges of the substrate 310, the solder resist layer 380 may be detached from the substrates 310 due to a weak adhesive strength between the solder resist layer 380 and the third ground lines 323. However, according to the present embodiment, the solder resist layer 380 may contact the third extended ground lines 323b and the insulation layer 311 which are arranged to alternate along the edges of each substrate 310. Thus, even when an adhesive strength between the solder resist layer 380 and the third extended ground lines 323b is low, a total adhesive strength of the solder resist layer 380 may be improved or enhanced due to a relatively strong adhesive strength between the solder resist layer 380 and the insulation layer 311. Accordingly, detachment of the solder resist layer 380 may be prevented, reduced, or minimized during the sawing process.

Figure 16:
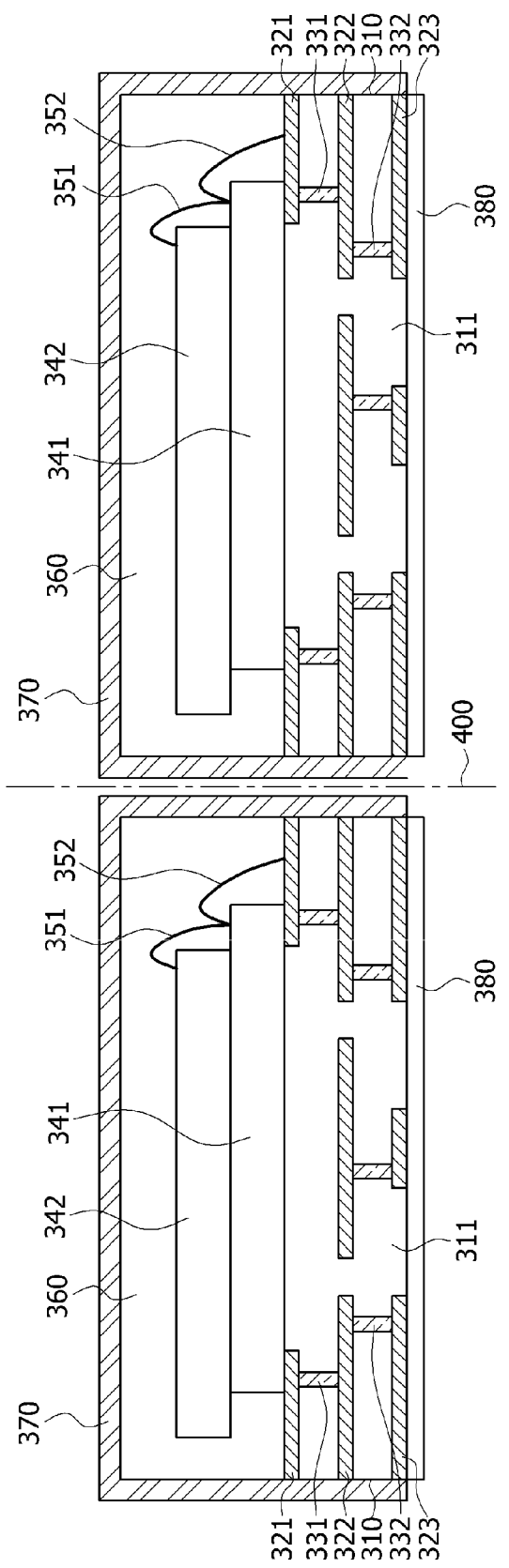

Referring to FIG. 16, an EMI shielding layer 370 may be formed on each molding member 360. The EMI shielding layer 370 may be formed to cover a top surface and sidewalls of the molding member 360, and may extend onto or along the sidewalls of the separate substrate 310. Thus, in some embodiments, the EMI shielding layer 370 may be formed to contact the first extended ground lines 321b, the second extended ground lines 322b, the third extended ground lines 323b and the substrate 310.

As described with reference to FIG. 15, the substrates 310 may be separated from each other by a single sawing or cutting process. In some embodiments, the substrates 310 may be separated from each other by a plurality of sawing processes. For example, a first sawing process may be performed along the cutting line 400 until the first extended ground lines 321b are exposed and the EMI shielding layer 370 may be formed to cover the separate molding members 370 and to contact the first extended ground lines 321b.

Subsequently, a second sawing process may be performed to completely separate the substrates 310 from each other. Thus, the semiconductor package 100 illustrated in FIG. 1 may be formed. Similarly, a first sawing process may be performed along the cutting line 400 until the first and second extended ground lines 321b and 322b are exposed, and the EMI shielding layer 370 may be formed to cover the separate molding members 370 and to contact the first and second extended ground lines 321b and 322b. Subsequently, a second sawing process may be performed to completely separate the substrates 310 from each other. Thus, the semiconductor package 200 illustrated in FIG. 4 may be formed.

In some embodiments, the semiconductor packages having the EMI shielding layers described above may be applied to various electronic systems.

Figure 17:
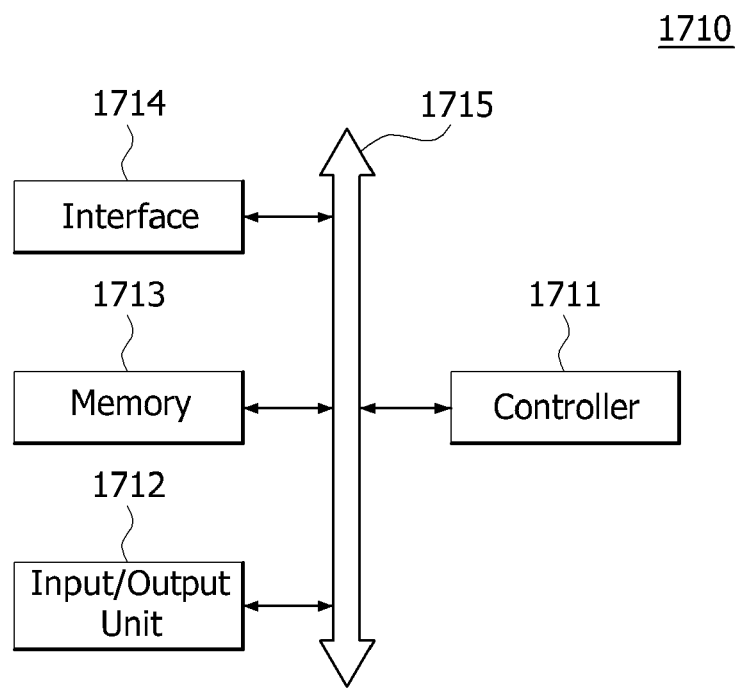
FIG. 17 is a block diagram illustrating an electronic system including semiconductor packages according to some embodiments of the present disclosure.

Referring to FIG. 17, the semiconductor packages described herein may be applied to an electronic system 1710. The electronic system 1710 may include a controller 1711, an input/output unit 1712, and a memory 1713. The controller 1711, the input/output unit 1712 and the memory 1713 may be coupled with one another through a bus 1715 providing a path through which data is transmitted.

For example, the controller 1711 may include at least any one of at least one microprocessor, at least one digital signal processor, at least one microcontroller, and logic devices capable of performing the same functions as these components. The controller 1711 or the memory 1713 may include at least any one of the semiconductor packages described herein. The input/output unit 1712 may include at least one selected among a keypad, a keyboard, a display device, a touch screen and so forth. The memory 1713 is a device for storing data. The memory 1713 may store data and/or commands to be executed by the controller 1711, and so on.

The memory 1713 may include a volatile memory device such as a DRAM and/or a nonvolatile memory device such as a flash memory. For example, a flash memory may be mounted to an information processing system such as a mobile terminal or a desktop computer. The flash memory may constitute a solid-state disk (SSD). Thus, the electronic system 1710 may stably store a large amount of data in a flash memory system.

The electronic system 1710 may further include an interface 1714 suitable for transmitting and receiving data to and from a communication network. The interface 1714 may be a wired or wireless type. For example, the interface 1714 may include an antenna or a wired or wireless transceiver.

The electronic system 1710 may be part of or realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system, and/or an information transmission/reception system.

When the electronic system 1710 includes components capable of performing wireless communication, the electronic system 710 may be used in a communication system such as CDMA (code division multiple access), GSM (global system for mobile communications), NADC (north American digital cellular), E-TDMA (enhanced-time division multiple access), WCDMA (wideband code division multiple access), CDMA2000, LTE (long term evolution) and Wibro (wireless broadband Internet).

Figure 18:
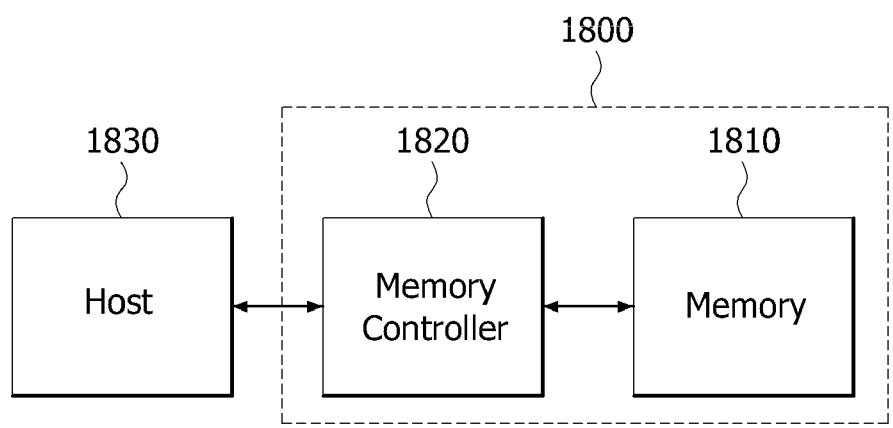
FIG. 18 is a block diagram illustrating another electronic system including semiconductor packages according to some embodiments of the present disclosure.

Referring to FIG. 18, the semiconductor packages described herein may be provided in the form of a memory card 1800. For example, the memory card 1800 may include a memory 1810 such as a nonvolatile memory device and a memory controller 1820. The memory 1810 and the memory controller 1820 may store data or read stored data.

The memory 1810 may include at least various nonvolatile memory devices to which the packaging technologies described herein are applied. The memory controller 1820 may control the memory 1810 such that stored data is read out or data is stored in response to a read/write request from a host 1830.

The embodiments have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A semiconductor package comprising:
    a substrate including an insulation layer;
    a first ground line including a first internal ground line disposed along edges of the substrate and a plurality of first extended ground lines extending between the first internal ground line and sidewalls of the substrate, the plurality of first extended ground lines including end portions that are exposed at the sidewalls of the substrate, and being spaced apart from each other along the edges of the substrate by the insulation layer;
    a chip on the substrate;
    a molding member disposed on the substrate and covering the chip; and
    an electromagnetic interference (EMI) shielding layer covering the molding member, the EMI shielding layer extending along the sidewalls of the substrate and alternately contacting the end portions of the plurality of first extended ground lines and exposed portions of the sidewalls of the insulation layer along a circumference of the substrate.

2. The semiconductor package of claim 1, wherein the first ground line is disposed on a top surface of the substrate.

3. The semiconductor package of claim 2, further comprising:
    a second ground line disposed in the substrate; and
    a third ground line disposed on a bottom surface of the substrate opposite to the top surface.

4. The semiconductor package of claim 3,
    wherein the third ground line includes a third internal ground line disposed along the edges of the substrate and a plurality of third extended ground lines extending between the third internal ground line and the sidewalls of the substrate; and
    wherein end portions of the plurality of third extended ground lines are exposed at the sidewalls of the substrate.

5. The semiconductor package of claim 4, wherein the plurality of third extended ground lines are spaced apart from each other along the edges of the substrate by the insulation layer.

6. The semiconductor package of claim 3, further comprising:
    a solder resist layer attached to the insulation layer and the third extended ground lines.

* * * * *